United States Patent [19]

Hashimoto

[11] Patent Number: 5,557,118
[45] Date of Patent: Sep. 17, 1996

[54] HETERO-JUNCTION TYPE BIPOLAR TRANSISTOR

[75] Inventor: Takasuke Hashimoto, Tokyo, Japan

[73] Assignee: NEC Corporation, Tokyo, Japan

[21] Appl. No.: 352,053

[22] Filed: Nov. 30, 1994

[30] Foreign Application Priority Data

Dec. 20, 1993 [JP] Japan .................. 5-319468

[51] Int. Cl.$^6$ ............... H01L 31/0328; H01L 31/0336; H01L 31/0312
[52] U.S. Cl. ............... 257/197; 257/198; 257/77
[58] Field of Search ................... 257/197, 198, 257/77, 190

[56] References Cited

U.S. PATENT DOCUMENTS 5,075,743  12/1991  Behfar-Rad ................ 257/190
5,144,398   9/1992  Morishita ..................... 257/77

FOREIGN PATENT DOCUMENTS 2-196432  8/1990  Japan .

*Primary Examiner*—Wael M. Fahmy
*Attorney, Agent, or Firm*—Burns, Doane, Swecker & Mathis, LLP

[57] ABSTRACT

A hetero-junction type bipolar transistor has an SiGe layer as a base layer and an SiC layer as an emitter layer. Between the SiGe layer and the SiC layer of the hetero-junction bipolar transistor, a monocrystalline layer having a lattice constant between the lattice constant of SiGe and that of SiC.

3 Claims, 6 Drawing Sheets

5,557,118

HETERO-JUNCTION TYPE BIPOLAR TRANSISTOR

BACKGROUND OF THE INVENTION a) Field of the Invention

This invention relates to a hetero-junction type bipolar transistor.

b) Description of the Related Art

Thinning a base to obtain a high-speed bipolar transistor leads to problems of an increase of a base resistance and of a decrease of a breakdown voltage. To prevent these problems, a high-concentration base can be used. This, however, causes other problems that a current gain is reduced and that a tunnel current is generated. One way to obtain a high-concentration base without these problems is to form a base-emitter hetero junction by the use of a narrow gap base or a wide gap emitter. It is known in the art that when an emitter is formed of a semiconductor having a greater forbidden band energy gap than an associated base, i.e., a wide-gap-emitter hetero junction, a current gain can be very high because when proper materials are selected the band gap of the emitter-base junction can be set not to a significant barrier against electrons but a substantial barrier against holes. Further, since a wide gap emitter can prevent a tunnel current which may be generated in the case of high-concentration junction, an emitter concentration can be reduced. Specifically, SiC is a typical material for a wide gap emitter when silicon is used for an associated base.

Another way to solve the above-mentioned problems is to use a narrow-band-gap-base hetero-junction type bipolar transistor in which a semiconductor having a band gap narrower than associated emitter is used as its base. In particular, the use of mixed crystals of SiGe as a base has been the subject of a great deal of work. It is well-known that a gradient in the concentration of Ge in the base by the use of mixed crystals of SiGe generates an electric field capable of accelerating minority carriers running through the base, to provide a high-speed device.

Further, it is also known that a bipolar transistor of still higher performance can be obtained when a base is an SiGe layer and an emitter is an SiC layer (See the hetero-junction type bipolar transistor 100 of FIG. 1, in which 106 is an SiGe layer and 108 is an SiC layer). In this modification, however, the base consists of a different semiconductor film from that of the emitter, so that mismatching in lattice takes place at their interface. As a result, a lattice defect and/or crystal deformation due to a stress occurs and then deteriorates the characteristics of the transistor, e.g., reduction in current gain.

To solve these problems in the hetero-junction type bipolar transistor 100, Japanese Patent Laid-Open No. 196432/1990 has proposed a hetero-junction type bipolar transistor 200 shown in FIG. 2 which is prepared by forming a silicon oxide film 230(or a silicon nitride film) on an Si base layer 206 and then forming an emitter layer, a polycrystalline semiconductor film 208 of a material other than Si over the film 230. In the hetero-junction type bipolar transistor 200, the silicon oxide film 230 (or a silicon nitride film) inserted between the Si base layer 206 and the polycrystalline semiconductor film 208 of the material other than Si prevents the different crystals from directly contacting each other, to reduce crystal defects around its interface due to lattice mismatching or a crystal deformation under a stress.

However, when SiGe is used as a base and SiC as an emitter, as shown in the hetero-junction type bipolar transistor 100 in FIG. 1, the difference in lattice constant is much more prominent than when Si (lattice constants; SiC=4.4 Å, SiGe=5.5 Å) is used as a base, resulting that SiC may not epitaxially grow without dislocations at the interface.

When interposing a silicon oxide film or a silicon nitride film between a base and an emitter, as in the hetero-junction type bipolar transistor 200 illustrated in FIG. 2, the resistance of the emitter becomes too high and an epitaxial growth of an emitter on the base is restricted due to the presence of the insulating film between the emitter and the base, even though the thickness of the insulating film, 5–15 Å, is quite small.

SUMMARY OF THE INVENTION

An object of the present invention is therefore to provide a hetero-junction type bipolar transistor in which an emitter is formed by an epitaxial growth on the base with a reduced incidence of dislocation at the interface between two different layers.

In one aspect of the present invention, there is thus provided a hetero-junction type bipolar transistor having an SiGe base layer and an SiC emitter layer, comprising:

a monocrystalline layer formed between said SiGe base layer and said SiC emitter layer and having a lattice constant between the lattice constants of SiGe and of SiC.

In the hetero-junction type bipolar transistor according to the present invention, the monocrystalline layer having the lattice constant between those of SiGe and SiC is interposed as a spacer layer between the SiGe base layer and the SiC emitter layer during epitaxial growth of the Si emitter layer on the SiGe base layer. This may lead to reduction of interfacial dislocations. It is preferable to adjust the thickness of the monocrystalline layer within the range where the layer can be completely depleted not to impair the effect of the hetero junction.

Forming such a monocrystalline layer, which can reduce the incidence of lattice-mismatching, between the SiGe base and the SiC emitter layers as described above, can reduce crystal defects due to the said mismatching and crystal deformation due to a stress. Hence, a recombination current can be suppressed in the base and a sufficient current gain can be obtained. Thus, this has made it possible to provide a high-performance hetero-junction type bipolar transistor having both the advantages of a narrow band-gap base and of a wide-band emitter.

DETAILED DESCRIPTION OF THE INVENTION

EXAMPLE 1

Figure 1:
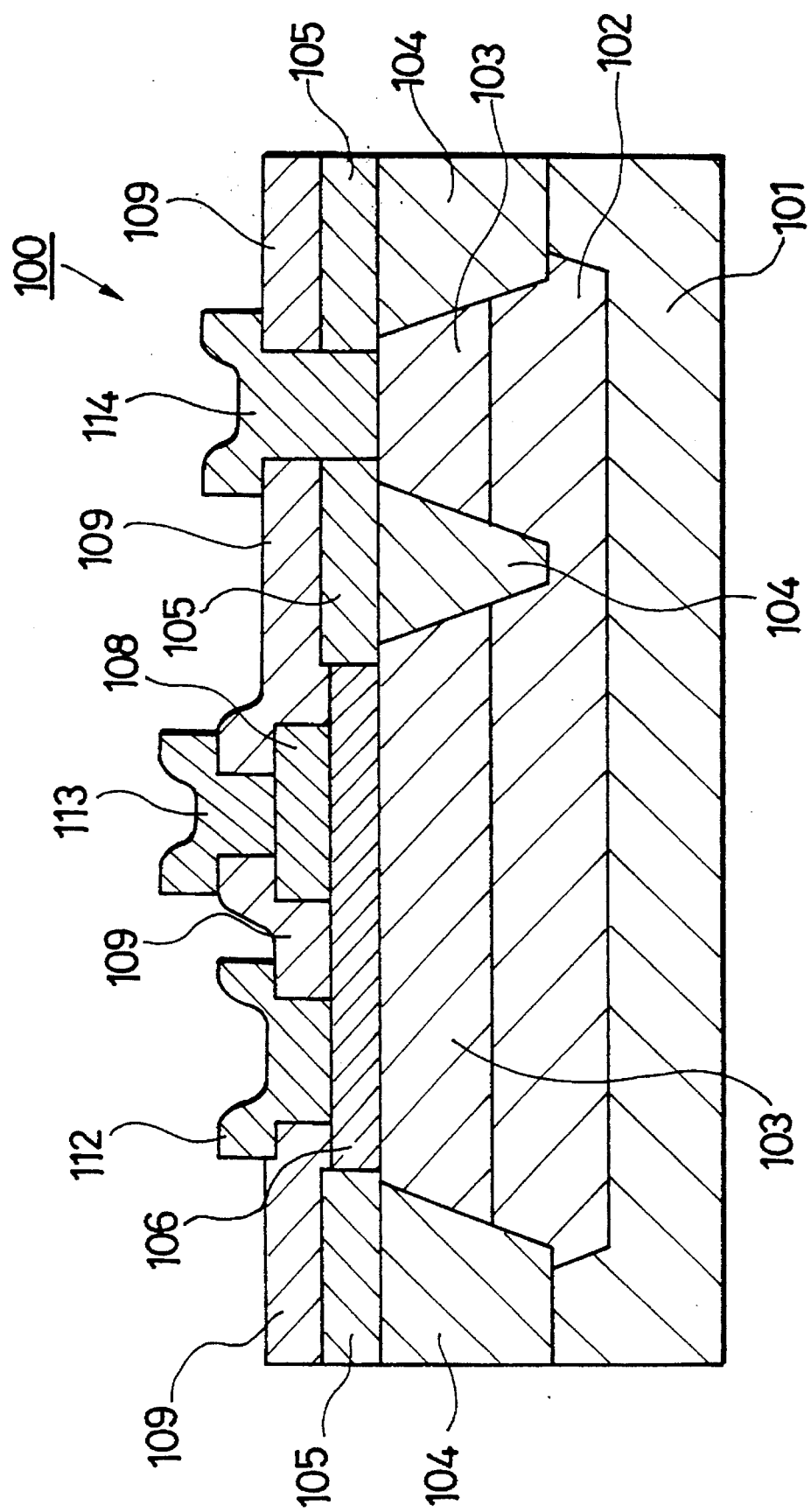
FIG. 1 is a cross-sectional view showing a vertical structure of a conventional hetero-junction type bipolar transistor having an SiGe layer as a base and an SiC layer as an emitter.
Figure 2:
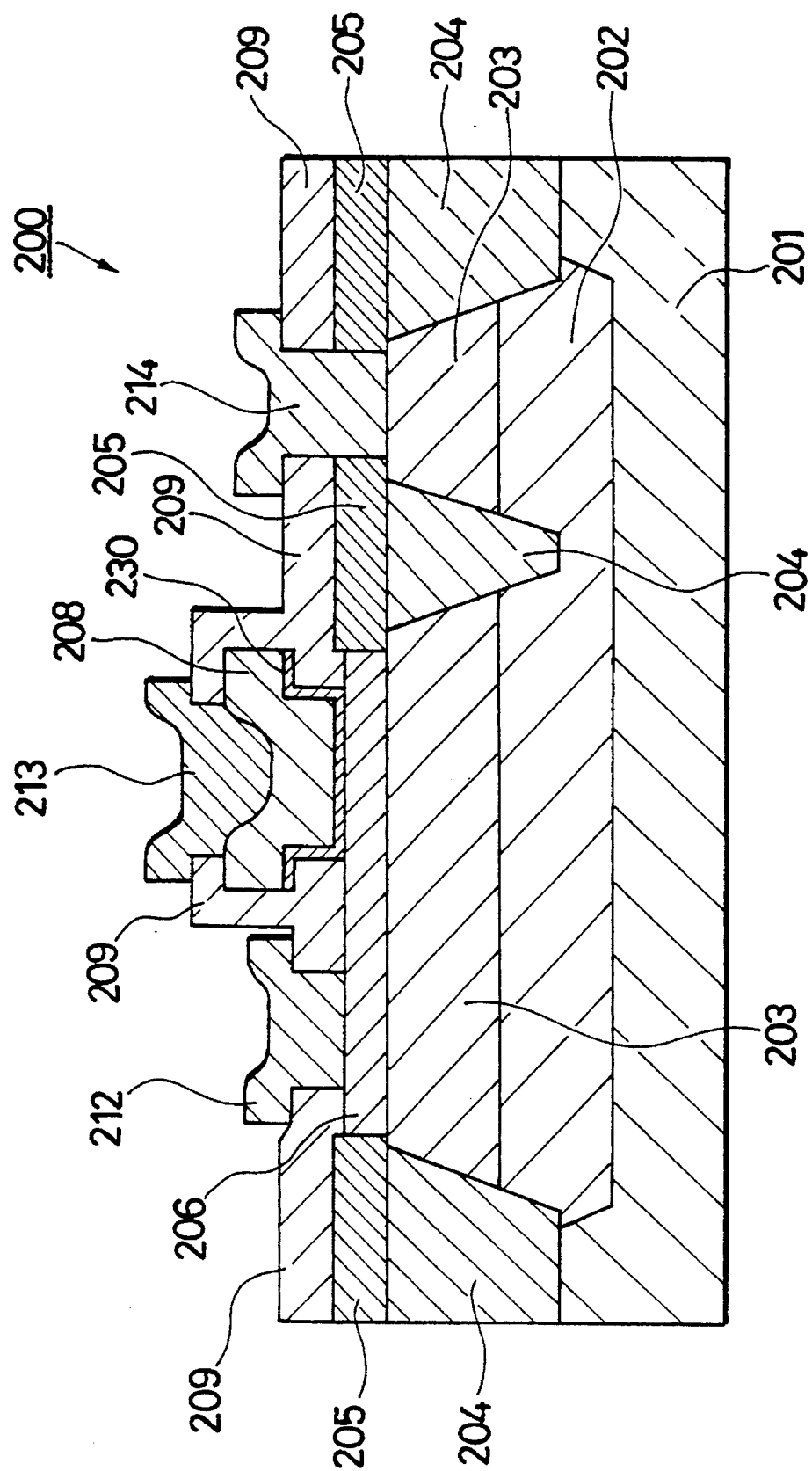
FIG. 2 is a cross-sectional view depicting the vertical structure of the hetero-junction type bipolar transistor disclosed in Japanese Patent Laid-Open No. 196432/1990.
Figure 3:
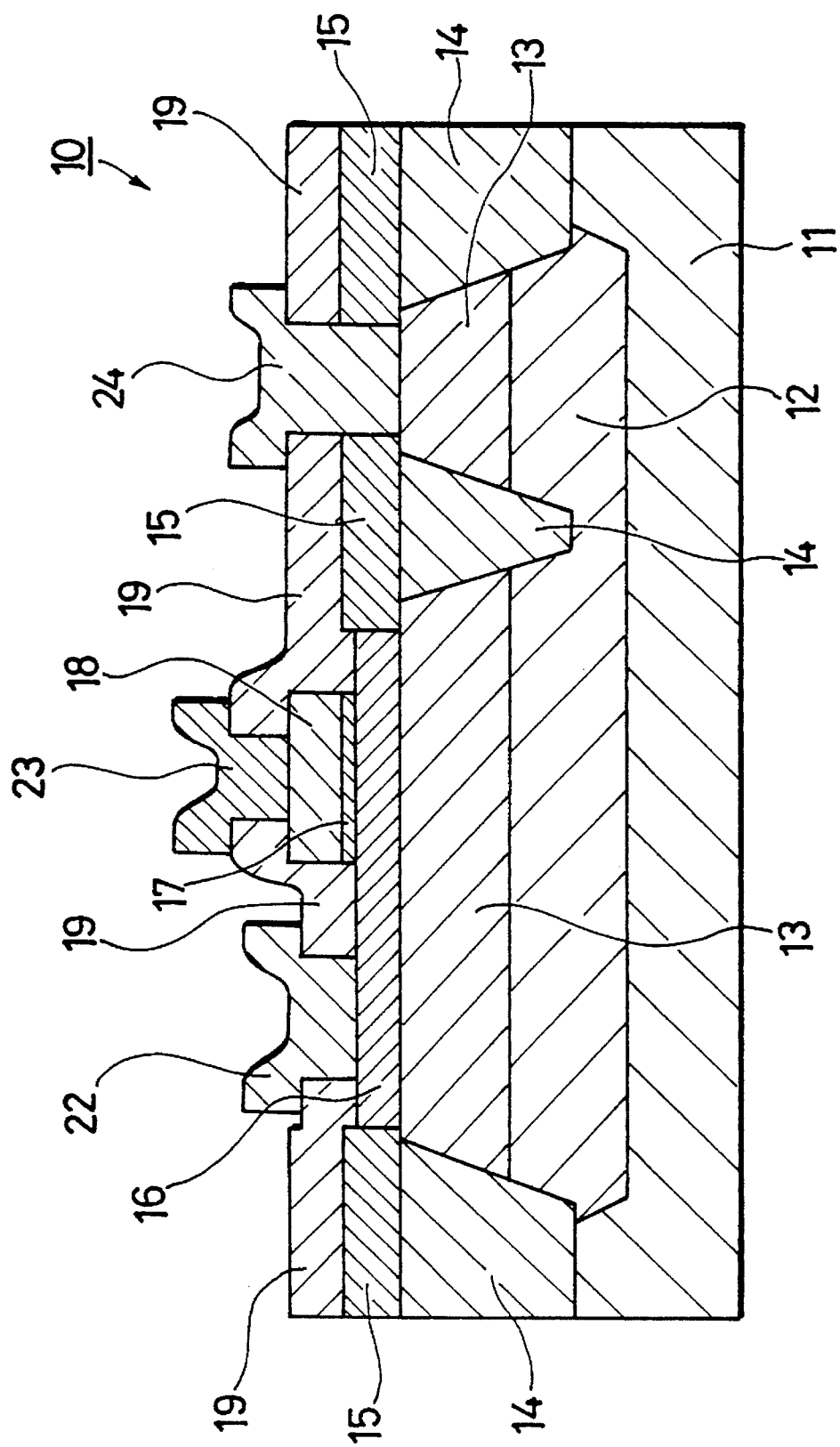
FIG. 3 is a cross-sectional view showing a vertical structure of a hetero-junction type bipolar transistor according to the first embodiment of the present invention.

Referring first to FIG.3, an example of the hetero-junction type bipolar transistor of the present invention will be described. The hetero-junction type bipolar transistor 10 has a different structure from that of the transistor 100 in FIG. 1. That is, the transistor 10 has the Si layer 17 having a lattice constant between those of SiGe and SiC which is formed as a spacer layer between the SiGe base layer 16 and the SiC emitter layer 18.

More specifically, the transistor 10 of the present invention comprises a p-type silicon substrate 11; an $n^+$-type low-resistance region 12 formed in the p-type silicon substrate 11; n-type silicon epitaxial layer 13 formed on the $n^+$-type low-resistance region 12; a field isolation region (an oxide film) 14 formed on the p-type silicon substrate 11; an interlayer insulation film 15 formed on the n-type silicon epitaxial layer 13 and the field isolation regions 14; the SiGe base layer 16 formed on the n-type silicon epitaxial layer 13 in the area between the two interlayer insulation films 15 on the left side thereof as viewed in FIG. 3; the silicon layer 17 formed on the SiGe base layer 16 on the right side thereof as viewed in the figure; the SiC emitter layer 18 formed on the Si layer 17; an insulation film 19 formed on the interlayer insulation film 15; the SiGe base layer 16 and the SiC emitter layer 18; an aluminum base electrode 22 formed in electrical contact with the SiGe base layer 16 on the left side thereof as viewed in the figure via a first window 31 (See FIG. 6) formed by etching the insulation film 19; an aluminum emitter electrode 23 formed in electrical contact with the SiC emitter layer 18 via a second window 32(See FIG. 6) formed by etching the insulation film 19; and an aluminum collector electrode 24 formed in electrical contact with the n-type silicon epitaxial layer 13 via a third opening formed by etching the insulation film 19 and the corresponding interlayer insulation film 15.

A fabrication process of the hetero-junction type bipolar transistor 10 will next be described with reference to FIGS. 4 through 7, in which an electrode portion of the collector (namely, the aluminum collector electrode 24) of the hetero-junction type bipolar transistor 10 shown in FIG. 3 has been omitted.

Figure 4:
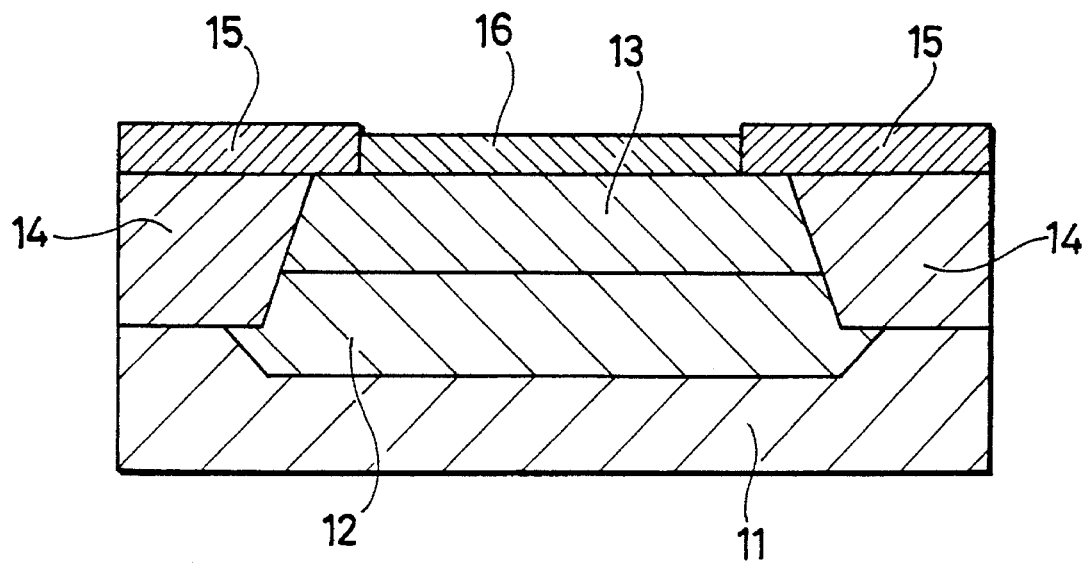
FIG. 4 is a cross-sectional view showing a fabrication process of the hetero-junction type bipolar transistor depicted in FIG. 3.

As is shown in FIG. 4, subsequent to formation of the $n^+$-type low-resistance region 12 in the p-type silicon substrate 11, the n-type silicon epitaxial layer 13 is formed on the $n^+$-type low-resistance region 12. A nitride film (not illustrated) is then formed over the p-type silicon substrate 11, followed by the removal of the nitride film by etching in regions where the field isolation regions 14 are to be formed. Oxidation is then conducted using the nitride film as a mask, whereby the field isolation regions 14 are formed. After the interlayer insulation film 15 has been deposited over the p-type silicon substrate 11 except for an area where the p-type SiGe base layer 16 is to be formed, the SiGe base layer 16 is epitaxially formed. The SiGe base layer 16 can be formed selectively on the n-type silicon epitaxial layer 13, or an SiGe layer can be formed over the entire area of p-type silicon substrate 11, followed by its removal by etching in the areas other than the area to be untouched.

Thereafter, a p-type Si film (not shown) to be used in formation of silicon layer 17, a spacer, is formed over the entire area of the p-type silicon substrate 11. Here, to avoid any impairment to the advantageous effects of the hetero junction between the SiC emitter layer 18 and the SiGe base layer 16, it is preferable to adjust the thickness of the p-type Si film to that not greater than the critical thickness of the film (namely, a film thickness at which a dislocation in a grown p-type type Si film begins, resulting in lattice relaxation), where the p-type Si film can be a completely depleted layer. For example, since a depletion layer is formed at about 100 Å on the side of the SiGe base layer 16, when the SiGe concentration of the SiGe base layer 16 is $6 \times 10^{18}$ atoms/cm$^3$ and the SiC concentration of the SiC emitter layer 18 is $2 \times 10^{19}$ atoms/cm$^3$, the thickness of the p-type Si film is preferably 100 Å or less, where the SiC concentration of the SiC emitter layer 18 is lower than the SiGe concentration of SiGe base layer 16 and a depletion layer is formed on the side of the SiC emitter layer 18, an n-type Si film is formed instead of a p-type Si film.

Figure 5:
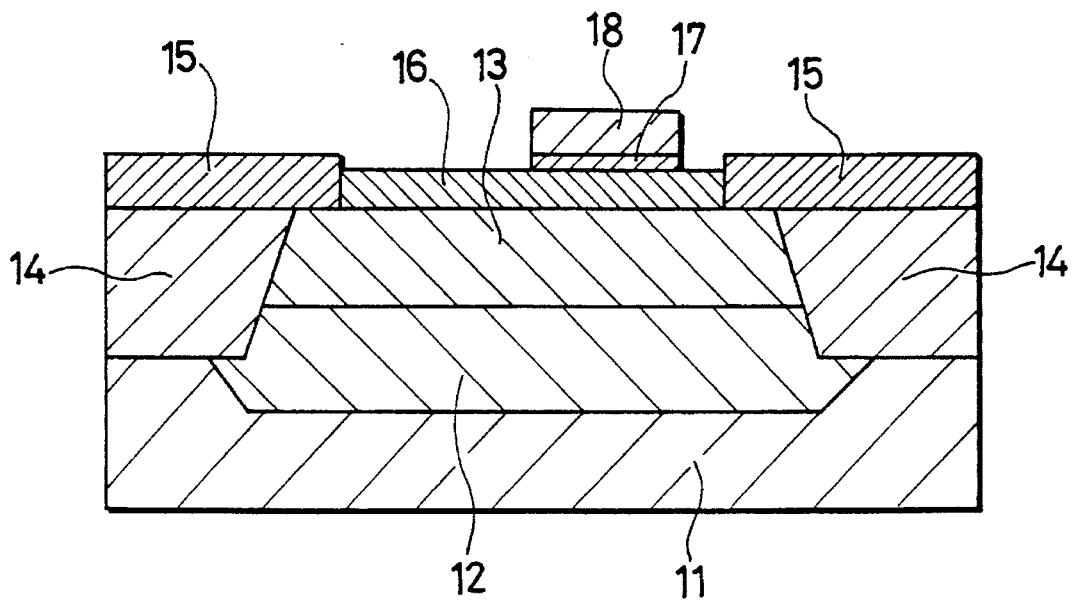
FIG. 5 is a cross-sectional view showing another fabrication process of the hetero-junction type bipolar transistor depicted in FIG. 3.

Then, after a monocrystalline or polycrystalline SiC film (not illustrated) for the formation the SiC emitter layer 18 has been formed over the entire area of the p-type silicon substrate 11, the p-type Si film in the regions other than the Si layer 17 and the monocrystalline or polycrystalline SiC film in the regions other than SiC emitter layers 18 are etched off, whereby as illustrated in FIG. 5, the p-type Si layer 17, a spacer, is formed at the predetermined position on the SiGe base layer 16 and the SiC emitter layer 18 is formed on the Si layer 17.

Figure 6:
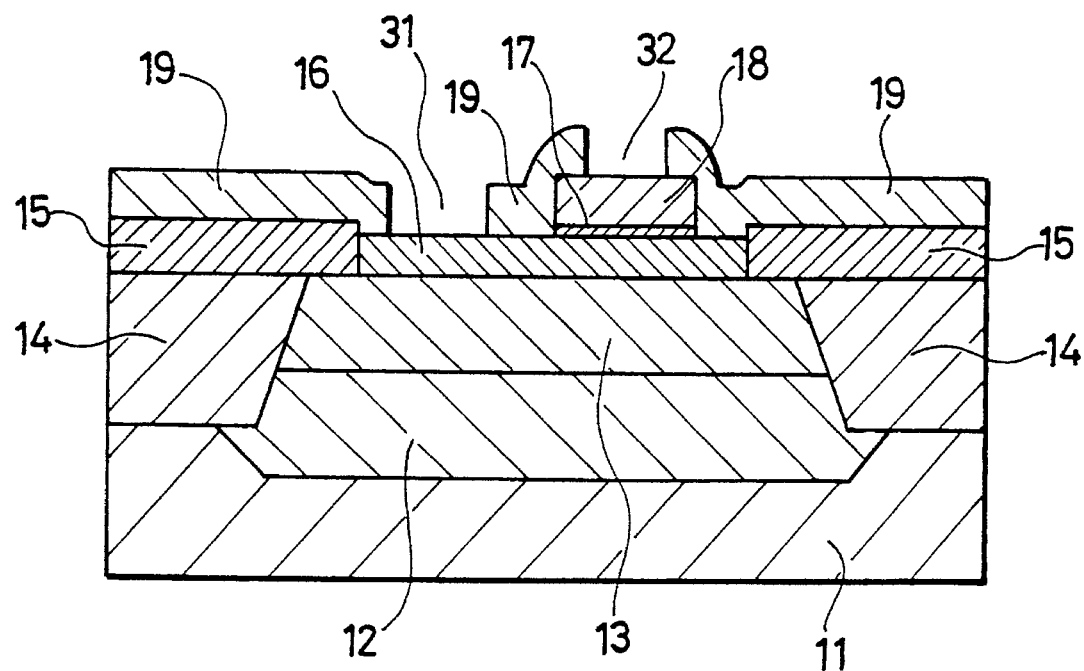
FIG. 6 is a cross-sectional view showing a further fabrication process of the hetero-junction type bipolar transistor depicted in FIG. 3.
Figure 7:
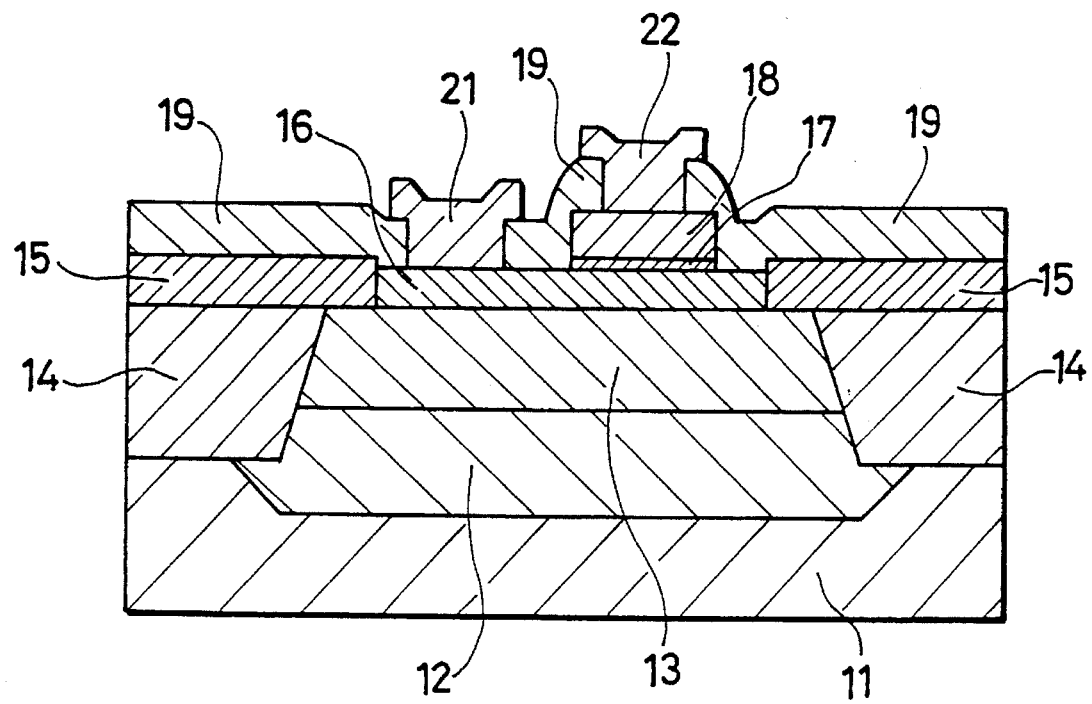
FIG. 7 is a cross-sectional view showing a still further fabrication process of the hetero-junction type bipolar transistor depicted in FIG. 3.

Subsequent to the formation of the insulation film 19 over the entire area of the p-type silicon substrate 11, the insulation film 19 is etched off in the predetermined regions so that, as is depicted in FIG. 6, the first window 31 for the electrical contact between the aluminum base electrode 22 and the SiGe base layer 16, the second window 32 for the electrical contact between the aluminum emitter electrode 23 and the SiC emitter layer 18 and the third window (not shown) for the electrical contact between the aluminum collector electrode 24 and the n-type silicon epitaxial layer 13 are formed. Subsequently, aluminum is vacuum-deposited over the entire area of the p-type silicon substrate 11 and is then subjected to patterning, so that the aluminum base electrode 22, the aluminum emitter electrode 23 and the aluminum collector electrode 24 (See FIG. 3) are formed.

In the hetero-junction type bipolar transistor 10 fabricated as described above, crystal defects due to lattice mismatching and crystal deformation due to a stress can be reduced. Recombination current in the base can therefore be suppressed. It was hence possible to obtain a current gain about three times as high as that available from the conventional direct formation of an SiC emitter layer on an SiGe base layer. Further, compared with the conventional process involving the interposition of a silicon oxide film or a silicon nitride film, the fabrication process according to the present invention has an advantage that SiC can be epitaxially formed without increase of an emitter resistance.

EXAMPLE 2

Next, another hetero-junction type bipolar transistor according to the present invention will be described with reference to FIG. 8.

Figure 8:
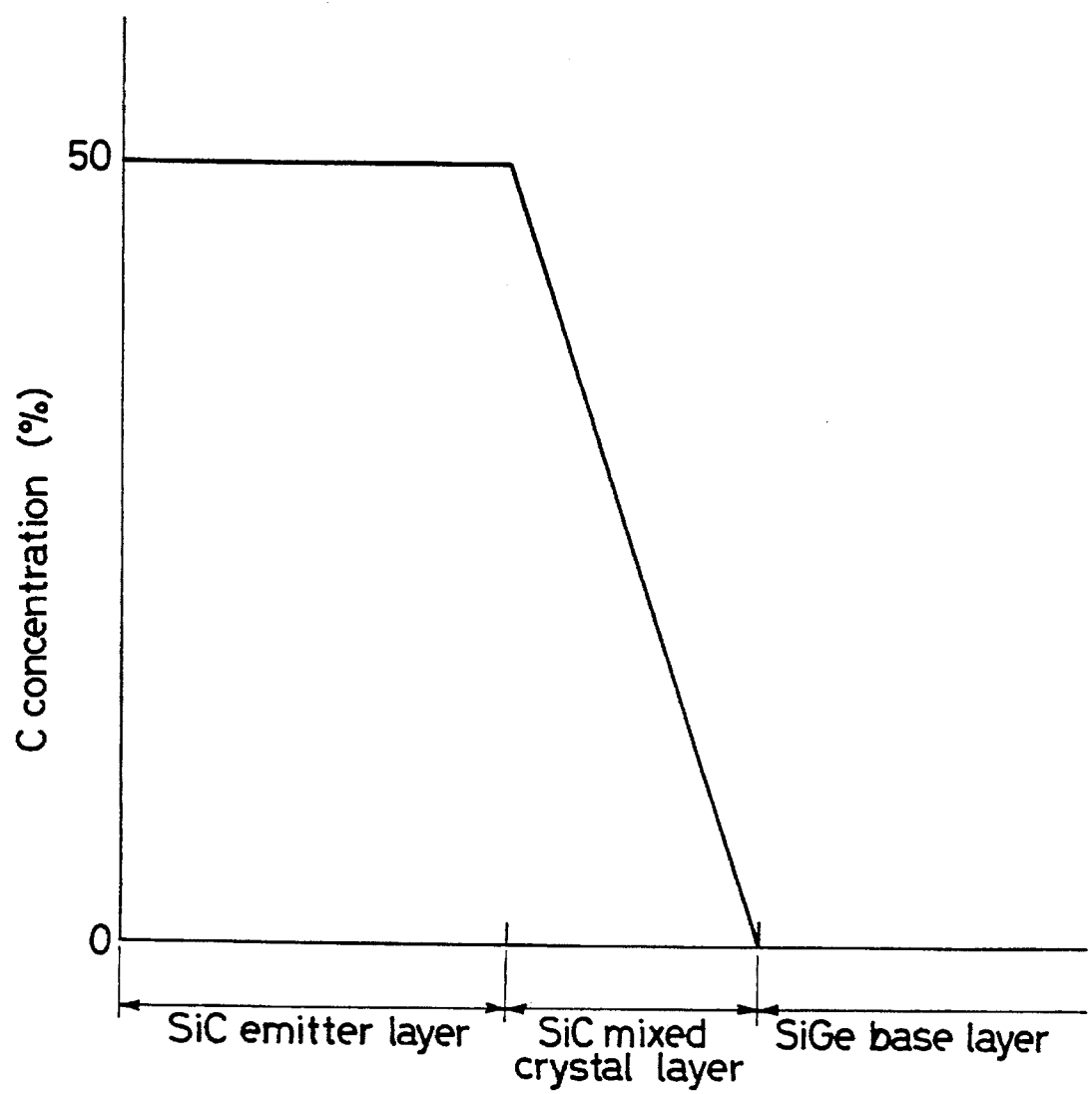
FIG. 8 diagrammatically shows gradual change of C concentration in the hetero-junction type bipolar transistor of Example 2 of the present invention.

In the hetero-junction type bipolar transistor of this example, a mixed crystal layer of SiC in which the concentration of C varies from 0% to 50% from a side of an SiGe base layer toward a side of an SiC emitter layer is formed as a spacer layer between the SiGe base layer and the SiC emitter layer to further reduce crystal deformation by a stress as illustrated in FIG. 8. Such spacer layer can be formed by the use of the method in which, during epitaxial growth of a mixed crystal layer of SiC to be used as a spacer layer, the flow rate of a C source gas (for example, $C_2H_2$ gas) is gradually changed to increase the concentration of C.

The hetero-junction type bipolar transistor according to this example has further reduced the interface trap density due to crystal deformation. Therefore, by suppressing a recombination current in the base, a current gain about 1.5 times as high as that available from the hetero-junction type bipolar transistor 10 of Example 1 was achieved.

What is claimed is:

1. A hetero-junction type bipolar transistor having an SiGe base layer and an SiC emitter layer, comprising:

a monocrystalline layer formed between said SiGe base layer and said SiC emitter layer, having a lattice constant between the lattice constant of SiGe and that of SiC, formed within a depletion layer in the emitter-base junction, and being thin enough to be completely depleted, wherein said monocrystalline layer is a mixed SiC crystal layer in which C concentration varies from 0% to 50% from said SiGe base layer toward said SiC emitter layer.

2. A hetero-junction type bipolar transistor according to claim 1, wherein said monocrystalline layer has the same conduction type as said SiGe base layer.

3. A hetero-junction type bipolar transistor according to claim 1, wherein said monocrystalline layer has a different conduction type from that of said SiGe base layer.

* * * * *